United States Patent [19]
Verma et al.

[11] Patent Number: 6,093,613
[45] Date of Patent: Jul. 25, 2000

[54] METHOD FOR MAKING HIGH GAIN LATERAL PNP AND NPN BIPOLAR TRANSISTOR COMPATIBLE WITH CMOS FOR MAKING BICMOS CIRCUITS

[75] Inventors: Purakh Raj Verma, Woodlands; Joe Jin Kuek, Singapore, both of Singapore

[73] Assignee: Chartered Semiconductor Manufacturing, Ltd, Singapore, Singapore

[21] Appl. No.: 09/020,496

[22] Filed: Feb. 9, 1998

[51] Int. Cl.$^7$ .................................................. H01L 21/331
[52] U.S. Cl. .......................... 438/309; 438/236; 438/204; 438/335
[58] Field of Search .................................. 438/309, 322, 438/325, 327, 335, 364, 236, 204

[56] References Cited

U.S. PATENT DOCUMENTS

| | | | |
|---|---|---|---|
| 4,167,425 | 9/1979 | Herbst | 148/1.5 |
| 4,264,382 | 4/1981 | Anantha et al. | 148/187 |
| 4,283,236 | 8/1981 | Sirsi | 438/335 |
| 4,546,536 | 10/1985 | Anantha et al. | 29/571 |
| 5,187,109 | 2/1993 | Cook et al. | |
| 5,326,710 | 7/1994 | Joyce et al. | |

*Primary Examiner*—Tuan H. Nguyen
*Attorney, Agent, or Firm*—George O. Saile; Rosemary L.S. Pike

[57] ABSTRACT

A method and lateral bipolar transistor structure are achieved, with high current gain, compatible with CMOS processing to form BiCMOS circuits. Making a lateral PNP bipolar involves forming an $N^-$ well in a $P^-$ doped silicon substrate. A patterned $Si_3N_4$ layer is used as an oxidation barrier mask to form field oxide isolation around device areas by the LOCOS method. A polysilicon layer over device areas is patterned to leave portions over the intrinsic base areas of the L-PNP bipolar an implant block-out mask. A buried $N^-$ base region is implanted in the substrate under the emitter region. A photoresist mask and the patterned polysilicon layer are used to implant the $P^{++}$ doped emitter and collector for the L-PNP. The emitter junction depth $x_j$ intersects the highly doped $N^+$ buried base region. This $N^+$ doped base under the emitter reduces the current gain of the unwanted (parasitic) vertical PNP portion of the L-PNP bipolar to reduce the current gain of the V-PNP. The built-in potential $V_{bi}$ of the emitter-base junction also increases further the current gain of the V-PNP thereby increasing the gain of the L-PNP bipolar transistor. By reversing the polarity of the dopants, L-NPN components can also be made. Also by implanting a tetravalent impurity such as Ge, Si, or C, the current gain of the L-PNP can be further improved.

24 Claims, 5 Drawing Sheets

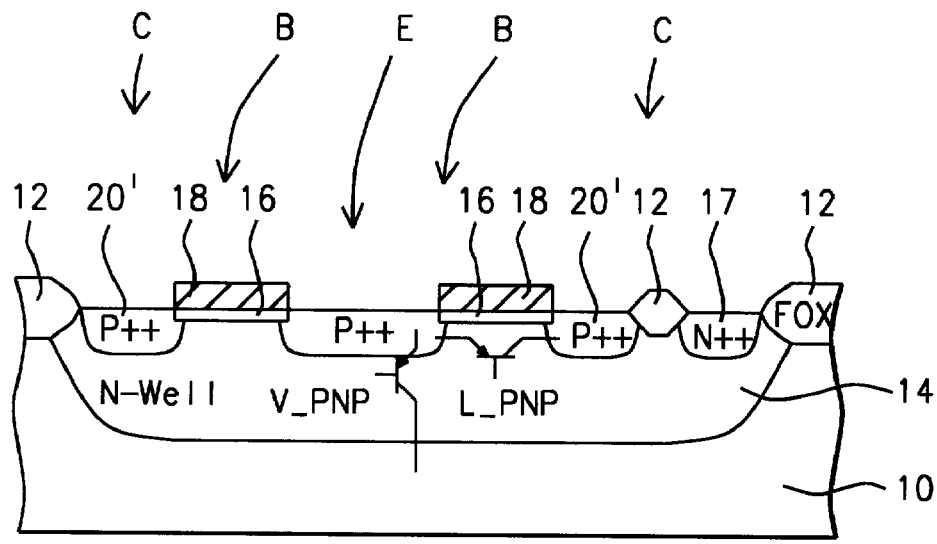
*FIG. 3A — Prior Art*
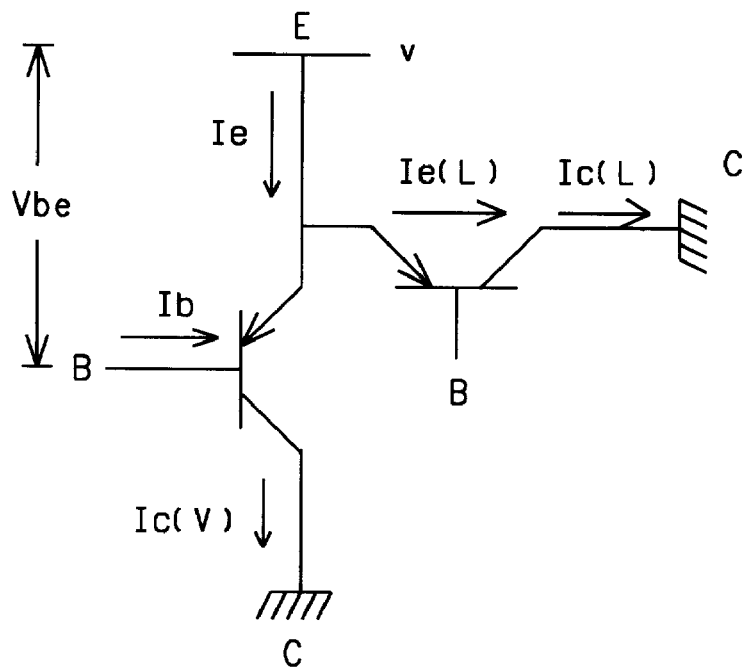
*FIG. 3B — Prior Art*

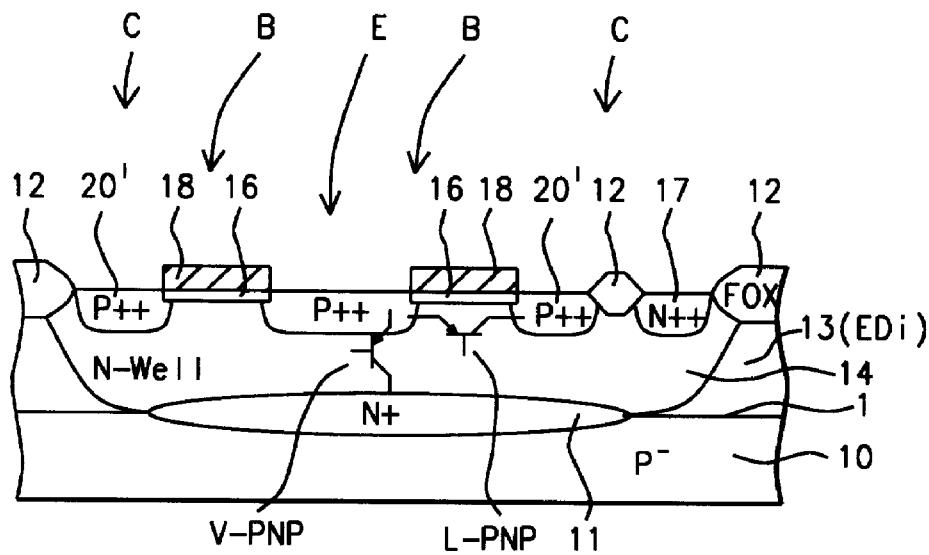
FIG. 4 – Prior Art
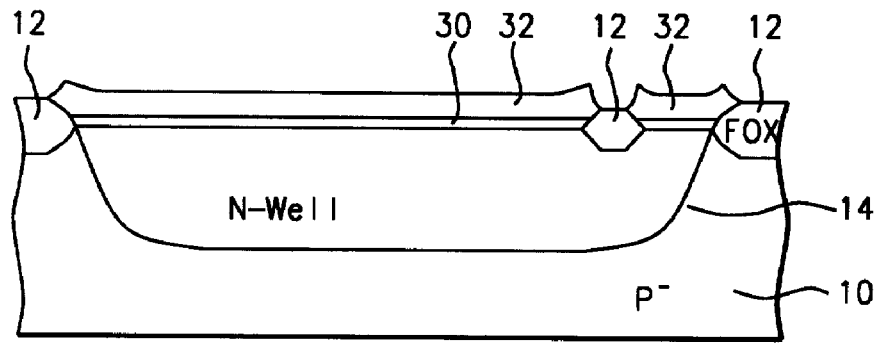
FIG. 5
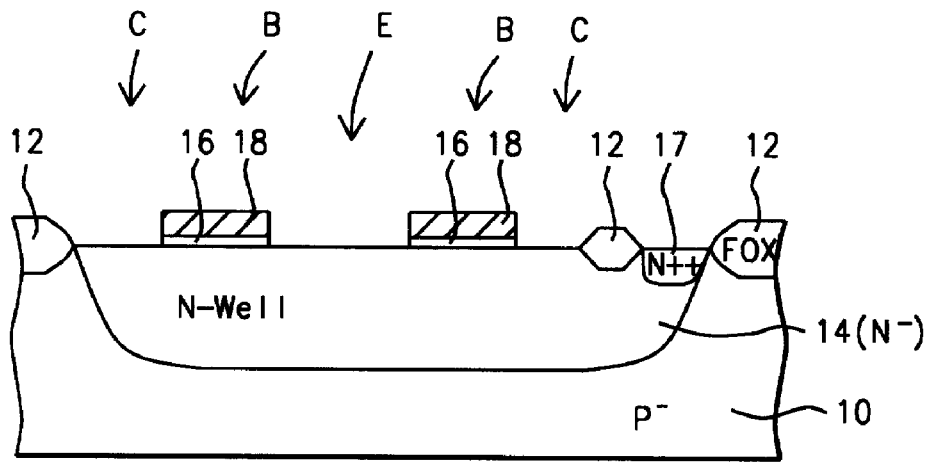
FIG. 6

METHOD FOR MAKING HIGH GAIN LATERAL PNP AND NPN BIPOLAR TRANSISTOR COMPATIBLE WITH CMOS FOR MAKING BICMOS CIRCUITS

BACKGROUND OF THE INVENTION

(1) Field of the Invention

The present invention relates to the fabrication of integrated circuit devices on semiconductor substrates, and more particularly relates to novel lateral PNP and NPN bipolar transistor structures with increased current gain and a method of fabrication. The process is compatible with CMOS processes for making BiCMOS integrated circuits.

(2) Description of the Prior Art

Bipolar and Complementary Metal-Oxide Semiconductor (CMOS) devices can be built on the same substrate to form BiCMOS circuits. These BiCMOS circuits provide additional advantages over either bipolar or CMOS circuits built separately on the same substrate. The bipolar transistor provides high current driver capabilities and is very useful as a constant current source and active load in many analog/digital applications. Alternatively, the CMOS devices composed of P and N-channel field effect transistors (NPN-FETs and PNP-FETs) offer low power consumption, high packing density, and dynamic memory storage capabilities. Unfortunately, the vertical bipolar transistors with high current gains (about 100) require more complex processing and increased manufacturing cost.

An alternative approach to using a conventional vertical bipolar transistor is to use a lateral PNP or NPN bipolar transistor which is more compatible with CMOS processing and still provides the constant current source and is very useful as an active load. The improved current-voltage (I-V) characteristics of the Lateral PNP bipolar transistor (also referred to as an L-PNP bipolar) are shown in FIG. 1 vs. the less desirable I-V characteristics of a P-channel FET (hereafter referred to as a PNP-FET) shown in FIG. 2. The comparison is for a lateral PNP bipolar having a 0.6 micrometer (um) base width and a PNP-FET having a 0.6 um channel length. As is clearly seen in FIG. 1, a family of I-V curves are shown for a series of constant base currents ($I_b$), where the base currents are increased in increments of 1 microampere from 0 to 4 microamperes, as depicted respectively by the curves $I_b(0)$, $I_b(1)$, $I_b(2)$, $I_b(3)$, and $I_b(4)$ in FIG. 1. The I-V curves are shown for a collector current ($I_c$) as a function of the applied collector bias voltage ($V_{ce}$) between the collector-emitter where the $I_c$ is measured in microamperes along the vertical axis Y, and the $V_{ce}$ is measured in volts along the horizontal axis X. As can be seen, the $I_c$ increases rapidly as a function of increasing $V_{ce}$ and remains essentially constant thereafter. For example, $I_c$ is essentially constant when $V_{ce}$ is greater than 0.25 volts. On the other hand, the PNP-FET shown in FIG. 2 does not have a flat drain current ($I_D$) region as a function of drain voltage ($V_D$) and does not provide the ideal constant current capability. This is best illustrated in FIG. 2 by the family of I-V curves for a series of different gate voltages $V_G$, where $V_G$ is varied in increments of 1.0 volts from 0 to 3 volts as depicted respectively by $V_G(0)$, $V_G(1)$, $V_G(2)$, and $V_G(3)$ in FIG. 2, and is held constant while the $I_D$ is plotted along the Y axis as a function of $V_D$ along the X axis. As is clearly seen by the family of curves, the $I_D$ varies significantly as a function of $V_D$ up to a $V_D$ of 5.0 volts, and therefore does not provide the desired constant current output.

However, the conventional L-PNP or L-NPN bipolar transistors have limitations, as is best described with reference to FIGS. 3A and 3B for a conventional prior art L-PNP bipolar transistor. One of these limitations is a substantially lower current gain (e.g. $I_c(L)/I_b < 5$, where $I_c(L)$ is the L-PNP collector current, and $I_b$ is the base current) for the L-PNP bipolar transistor. To best understand the reason for this low current gain, reference is made to FIG. 3A. A schematic cross-sectional view is shown for a conventional L-PNP bipolar transistor formed in a device area having an $N^-$ well 14 doped with arsenic or phosphorus on and in a P doped (boron) silicon substrate 10 and surrounded by a field oxide 12. This L-PNP is formed during fabrication of the FET by growing a gate oxide 16 and a polysilicon layer 18 which are patterned to leave portions over the intrinsic base region B formed from the $N^-$ well 14. Next an $N^{++}$ base contact 17 is made to the $N^-$ well. The $P^{++}$ emitter 20 and $P^{++}$ collector 20' are then formed in the emitter area E and collector area C by ion implanting boron ($B^{11}$), while the patterned polysilicon 18 serves as an implant blockout mask. Now as is clearly seen in FIG. 3A and depicted by the superimposed schematic diagram for the bipolar circuit elements V-PNP and L-PNP, the current gain of the L-PNP bipolar transistor is reduced because of the unwanted parasitic V-PNP bipolar portion of the lateral-PNP bipolar transistor between the emitter 20 and the substrate 10. This results in an unwanted V-PNP collector current $I_c(V)$ that reduces the desired collector current $I_c(L)$ of the L-PNP bipolar transistor, as depicted in FIG. 3B. Now as shown in FIG. 3B, when the emitter-base is forward biased ($V_{be}$), the emitter current $I_e$ injected into the $N^-$ well 14 (which serves as the N base for the L-PNP) results in an unwanted parasitic collector current $I_c(V)$ in the substrate 10, which reduces the collector current $I_c(L)$ of the L-PNP transistor to the collectors 20' (FIG. 3A) resulting in low current gain.

One prior-art method of improving upon these L-PNP bipolar transistors, shown in FIG. 4, is to form a $N^+$ region 11 in the $P^-$ substrate 10 followed by a $P^-$ epitaxial layer 13 (EPI) prior to forming the bipolar device. An $N^-$ well 14 is formed next in epitaxial layer 13 in which the L-PNP bipolar transistor is formed similar to the method of the prior art in FIG. 3A. This forms a heavily $N^+$ doped region at the V-PNP bipolar base-collector junction 1 under the $P^{++}$ emitter 20 to minimize the vertical PNP current gain thereby enhancing the lateral PNP current gain. However, this significantly reduces the reverse bias breakdown voltage at the base-collector junction 1. Also, minority carrier injection from the emitter 20 into the base area under the emitter 20 is not significantly reduced, which would further reduce the V-PNP current gain and increase the L-PNP current gain. The method also requires more processing steps that include growing a costly epitaxial layer and increases manufacturing cost.

One method of forming a lateral-PNP is described by Joyce et al., U.S. Pat. No. 5,326,710, in which devices having reduced parasitic capacitance between an $N^+$ buried layer and an epitaxial layer are formed by implanting N wells prior to growing the epitaxial layer. The process also provides reduced geometries for improved performance. Another method for making lateral bipolar transistors is described by Cook et al., U.S. Pat. No. 5,187,109, in which an $N^+$ epitaxy and an $N^-$ epitaxy are utilized for making an L-PNP bipolar transistor that is compatible with CMOS technology. A further method for making lateral bipolar transistors is described by Anantha et al. in U.S. Pat. No. 4,546,536. This method also uses an $N^-$ epitaxial layer grown on an $N^+$ diffused layer in a $P^-$ silicon substrate, and provides a method for fabricating lateral NPN transistors with reduced base areas and an emitter over an insulating layer to reduce the parasitic capacitance. Anantha et al., U.S. Pat. No. 4,264,382, use a recessed oxide under a portion of a L-PNP or L-NPN to improve current gain. U.S. Pat. No. 4,167,425 issued to Herbst describes a method for making a lateral PNP bipolar transistor having a buried $N^+$ layer and an $N^-$ epitaxial layer. The collector and emitter are then formed in the $N^-$ epitaxial layer over the buried $N^+$ layer.

Therefore, there is still a strong need in the semiconductor industry to make L-PNP and L-NPN bipolar transistors with improved current gain, compatible with CMOS technology, and at low manufacturing cost.

SUMMARY OF THE INVENTION

It is therefore a principal object of this invention to form lateral PNP and NPN bipolar transistor structures with improved current gain that are compatible with CMOS technology for making BiCMOS circuits.

It is another object of this invention to use a novel buried base region under the emitter of the lateral bipolar transistor to increase the built-in voltage ($V_{bi}$) at the emitter base junction of the vertical PNP (V-PNP) thereby reducing the current gain of the vertical bipolar transistor and increasing the current gain of the lateral bipolar transistor. Because of the relatively higher built-in voltage of the V-PNP emitter-base junction, the vertical injection of holes from the $P^{++}$ emitter is less than the lateral injection, thereby improving the lateral-PNP gain.

It is another objective of this invention to fabricate these L-PNP and L-NPN bipolar transistors without the need for a epitaxial layer using a cost effective manufacturing process.

A further object by a second embodiment of this invention is to modify the buried base region of the lateral bipolar transistor by implanting tetravalent impurities such as germanium (Ge), silicon (Si), or carbon (C) to reduce the minority carrier lifetime in this buried base region. This further reduces the current gain of the vertical bipolar transistor part of the lateral bipolar transistor, and thereby improves the current gain of the lateral bipolar transistor.

In accordance with the objects of the invention, a lateral bipolar transistor is described which uses a buried base region under the emitter. This reduces the current gain of the unwanted vertical transistor formed between the emitter and the substrate, and improves the current gain of the lateral transistor. By a second embodiment, the current gain of the lateral bipolar transistor is further improved by implanting a tetravalent impurity, such as Ge, Si, or C that reduces the minority carrier lifetime in the buried base region of the vertical bipolar transistor. Both NPN and PNP lateral transistors can be fabricated using this method, and is compatible with CMOS technology for making BiCMOS circuits. Only the L-PNP bipolar transistor is described, but by reversing the conductive type dopants, an L-NPN bipolar transistor can also be fabricated.

These high current gain lateral PNP bipolar transistors are fabricated by first providing a single-crystal semiconductor substrate. The substrate is doped with a P type dopant (first conductive type dopant) such as boron. N doped wells are formed next by ion implanting with a second conductive type dopant such as phosphorus. A pad oxide composed of silicon oxide is formed on the substrate, for example by thermal oxidation, followed by the deposition of a silicon nitride layer to provide an oxidation barrier layer. The silicon nitride layer ($Si_3N_4$) is then patterned leaving portions over device areas while the $Si_3N_4$ is removed over field oxide regions. Local oxidation of silicon commonly practiced in the industry is used to form the Field OXide (FOX). Alternatively a shallow trench isolation technology, as is well known in the industry, can be used in which the silicon substrate is recessed in the FOX regions and filled with a chemical vapor deposited (CVD) oxide which is made planar with the substrate surface. The $Si_3N_4$ layer is then removed using phosphoric acid. Successively, as is common in CMOS and BiCMOS technologies, a gate oxidation and a polysilicon deposition are done and the gate mask used to define the gate length also defines the base width of the L-PNP. This polysilicon layer is internally connected to the emitter of the Lateral-PNP transistor and also this layer acts as a $P^+$ implant blockout mask for the external base region between two $P^{++}$ regions in the $N^-$ well. The $P^{++}$ and $N^{++}$ heavily doped regions are formed consecutively with the $P^{++}$ and $N^{++}$ source/drain regions for PMOS and NMOS, respectively, and thereby provide a compatible process sequence for forming the emitter, collector, and base contact for the L-PNP transistor for the BiCMOS structure.

Continuing with the process and a key feature of this invention is the formation of $N^+$ buried base regions in the N wells under the emitter areas using a first photoresist mask as an implant mask. These buried base regions are implanted to lie within the N wells and are further formed in the V-PNP bipolar region. The buried base regions have a higher concentration than the N wells and are implanted to a depth such that when the $P^{++}$ emitters are later implanted, the emitter junction intersects the buried regions in the V-PNP bipolar region. The higher doped buried base region results in a lower current gain for the V-PNP bipolar without reducing the current gain for the L-PNP bipolar. Further, the increased doping of the emitter/base junctions for the V-PNP bipolar results in an increased built-in voltage when the emitter/base junctions are forward biased, thereby further reducing the current gain of the V-PNP bipolar between the emitter and substrate. This also results in improving the current gain of the L-PNP bipolar (for example, from about 5 to greater than 15).

A second photoresist mask and the patterned polysilicon layer are used as an implant mask and the emitters and collectors for the L-PNP bipolar transistors are selectively ion implanted using the first conductive type dopant, such as boron. The emitters and collectors are heavily doped ($P^{++}$). The second photoresist mask is then removed to complete the improved L-PNP bipolar transistors. By reversing the polarity of the dopants, improved L-NPN bipolar transistors can also be made.

By a second embodiment, the buried base region can be implanted with tetravalent impurities, such as germanium (Ge), silicon (Si), or carbon (C), to further reduce the minority carrier lifetime and thereby further reducing the gain of the vertical bipolar between the emitter and the substrate and improving the gain of the lateral bipolar transistor.

The process is now continued to form P-channel and N-channel FETs for making CMOS circuits on the same substrate. The lateral bipolar transistors are then interconnected to form the desired BiCMOS circuits.

BRIEF DESCRIPTION OF THE DRAWINGS

The objects and other advantages of the invention will become more apparent in the preferred embodiments when read in conjunction with the following drawings.

FIG. 3A shows a schematic cross-sectional view of a conventional low current gain prior-art L-PNP bipolar having a schematic circuit diagram of the L-PNP and V-PNP bipolar components superimposed on the cross section.

FIG. 3B is the schematic circuit diagram shown in FIG. 3A in greater detail.

FIG. 4 shows a schematic cross-sectional view of a conventional prior-art L-PNP bipolar having improved current gain using an N+ doped retrograde region formed after growing an epitaxial layer. Also shown is the schematic circuit diagram for the components of the V-PNP and the L-PNP bipolar components of the lateral transistor.

FIGS. 5 through 9 show a series of schematic cross-sectional views for a lateral PNP bipolar transistor for the sequence of processing steps for making this lateral PNP bipolar transistor with improved current gain by the method of this invention.

DESCRIPTION OF THE PREFERRED EMBODIMENTS

Figure 1:
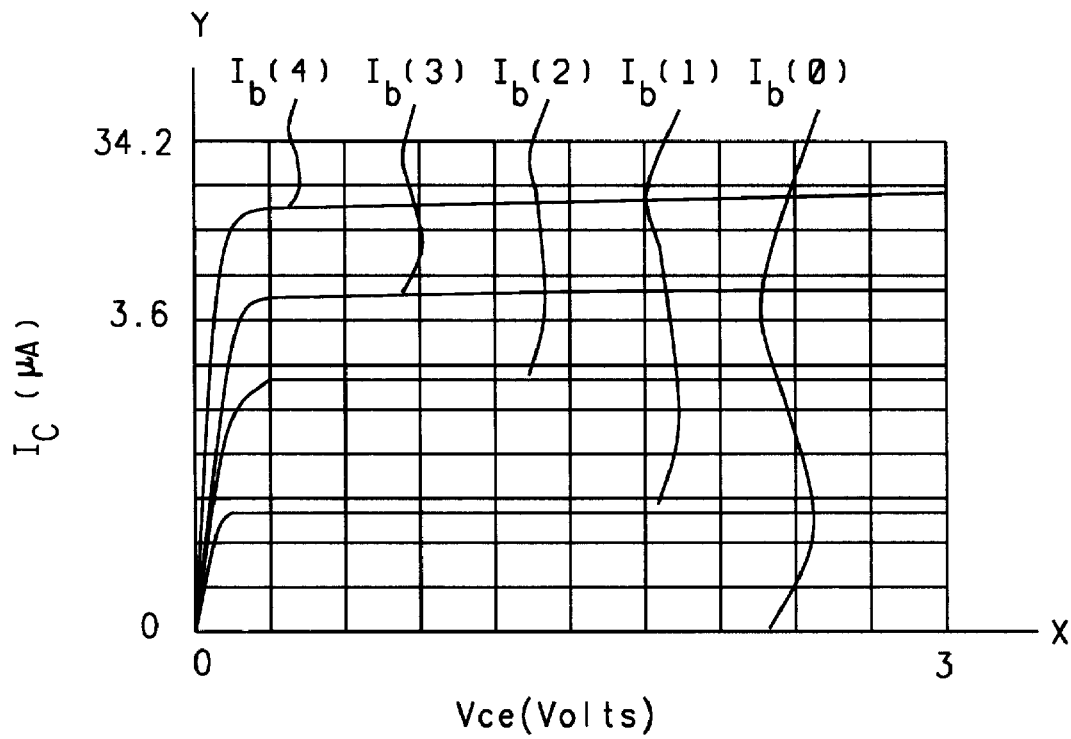
FIGS. 1 and 2, respectively, show graphs of the current-voltage (I-V) characteristics for a lateral PNP bipolar and a P-channel FET.
Figure 2:
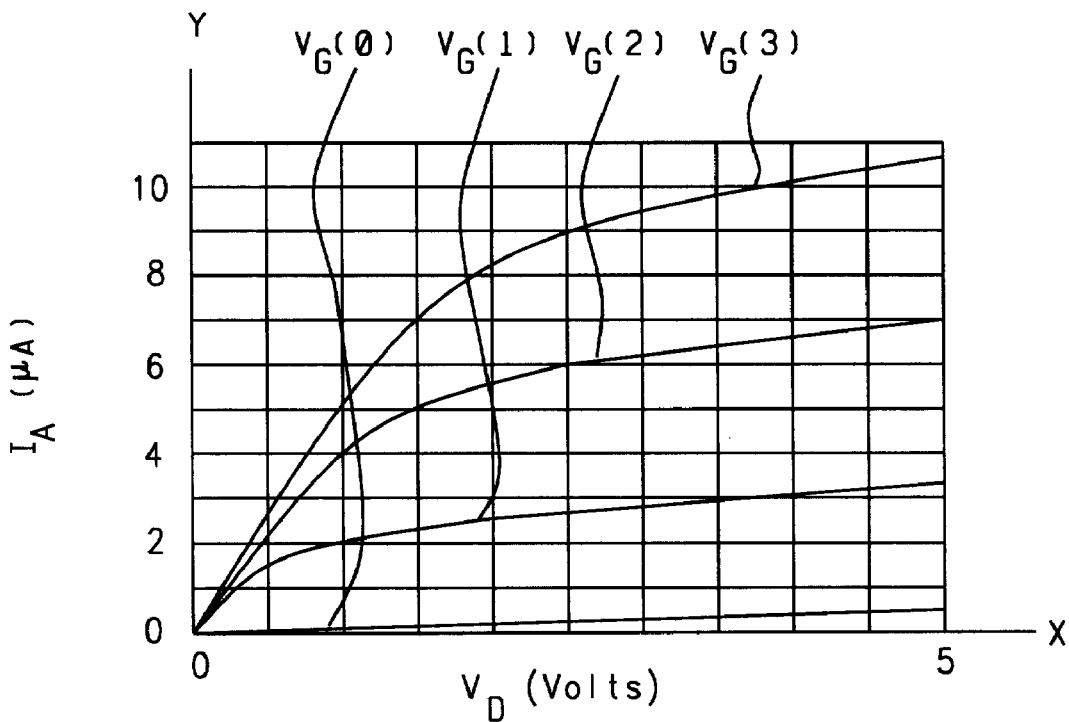

The method of making these improved lateral bipolar transistors with higher current gain is described in detail. The method is described for a lateral PNP (L-PNP) bipolar transistor, but it should be well understood by those skilled in the art that by reversing the polarity of the conductive dopants lateral NPN (L-NPN) bipolar transistors can also be made. It should also be well understood by those skilled in the art that other device structures can be formed. For example, by including additional processing steps, both P-channel and N-channel FETs can be made on the same substrate and in the same chip area to form Complementary Metal-Oxide Semiconductor (CMOS) circuits and utilized with the above lateral bipolar transistors to make Bipolar/CMOS (BiCMOS) circuits.

Referring now more particularly to FIGS. 5 through 9 for a first embodiment, the method for making L-PNP bipolar transistors is described. The method begins by providing a semiconductor substrate 10. Typically the substrate 10 is a single-crystal silicon having a <100> crystallographic orientation. The substrate is preferably doped with a first conductive type dopant, which is a P type dopant such as boron (B), and is doped to a concentration of between about 5.0 E 14 and 1.0 E 16 atoms/cm$^3$.

N doped wells 14 are formed next by ion implanting with a second conductive type dopant such as phosphorus. Preferably the N wells are doped to a concentration of between about 1.0 E 16 and 1.0 E 17 atoms/cm$^3$ and the junction depth of the N well in the P$^-$ silicon substrate is between about 1.0 and 3.0 micrometers (um). Next a pad oxide 30 composed of silicon oxide (SiO$_2$) is formed on the substrate, for example by thermal oxidation. The pad oxide is grown to a thickness of between about 200 and 300 Angstroms. A silicon nitride (Si$_3$N$_4$) layer 32 is deposited over the pad oxide 30 to provide an oxidation barrier layer. The Si$_3$N$_4$ 32 is deposited by low pressure chemical vapor deposition (LPCVD), using dichlorosilane (SiCl$_2$H$_2$) and ammonia (NH$_3$), and to a preferred thickness of between about 1200 and 1700 Angstroms. The silicon nitride layer 32 is then patterned leaving portions over device areas while the Si3N$_4$ is removed over areas where field oxide isolation is desired. The Field OXide (FOX) 12 can be formed by any conventional process. For example, LOCal Oxidation of Silicon (LOCOS), commonly practiced in the industry, can be used to form the Field OXide (FOX), as shown in FIG. 5. Typically the LOCOS is formed by thermal oxidation and is grown to a thickness of between about 5000 and 9000 Angstroms. Alternatively, other methods, such as shallow trench isolation technology, can be used as is also well known in the industry (not depicted in FIG. 5). For example, if a shallow trench isolation is used, it can be made by recessing the silicon substrate 10 and filling with a CVD oxide which is made planar with the substrate surface.

Referring now to FIG. 6, the Si$_3$N$_4$ layer 32 is stripped off and a new layer 16 used as the gate oxide is grown to a thickness of between about 100 and 200 Angstroms, followed by the deposition of a polysilicon layer 18 having a thickness of between about 2000 and 3500 Angstroms. Layer 18 is then doped using POCl$_3$. Layer 18 also forms the gate electrodes for the FETs on the CMOS devices. The polysilicon layer 18 is then patterned by conventional photolithographic techniques and anisotropic plasma etching to leave portions over the base areas B for the L-PNP bipolar transistors and in the gate areas of the CMOS FET portions. Using a blockout mask (not shown), a heavily doped base contact region 17 are formed by ion implantation in the N well 14 to provide good ohmic contacts for the base of the L-PNP bipolar. For example, the base contact 17 can be formed by implanting arsenic or phosphorus to provide a concentration of between about 1.0 E 19 and 1.0 E 20 atoms/cm$^3$. These N$^{++}$ implants and the later P$^{++}$ implantations for the L-PNP also form simultaneously the N$^{++}$ and P$^{++}$ source/drain implants for the NMOSFET and the PMOSFET, respectively.

Figure 7:
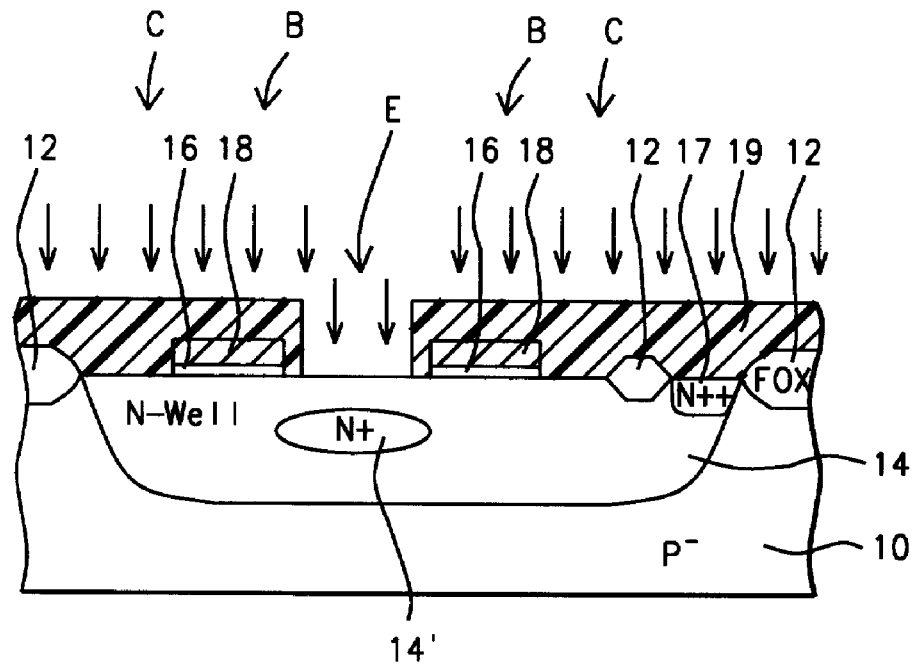

Referring now to FIG. 7 and continuing with the process, a key feature of this invention is the formation of N+ buried base regions 14' in the N wells 14 under the emitter areas E. A first photoresist mask 19 is used as an implant blockout mask to selectively implant the buried base regions 14'. Preferably the ion implantation, as depicted by the vertical arrows 5, is carried out to form the buried base regions 14' below the substrate surface. The N+ buried base regions are preferably formed by implanting phosphorus (P$^-$). The implant dose and ion implant energy are selected to provide a final dopant concentration of between about 5.0 E 17 and 2.0 E 18 atoms/cm$^3$, at a depth $x_j$, which is equal to the junction depth of the emitter that is subsequently formed. This N+ buried base region increases the dopant level under the emitter and, as will shortly be seen, reduces the current gain of the V-PNP bipolar portion of the lateral PNP bipolar transistors and consequently increases the L-PNP bipolar current gain.

Figure 8:
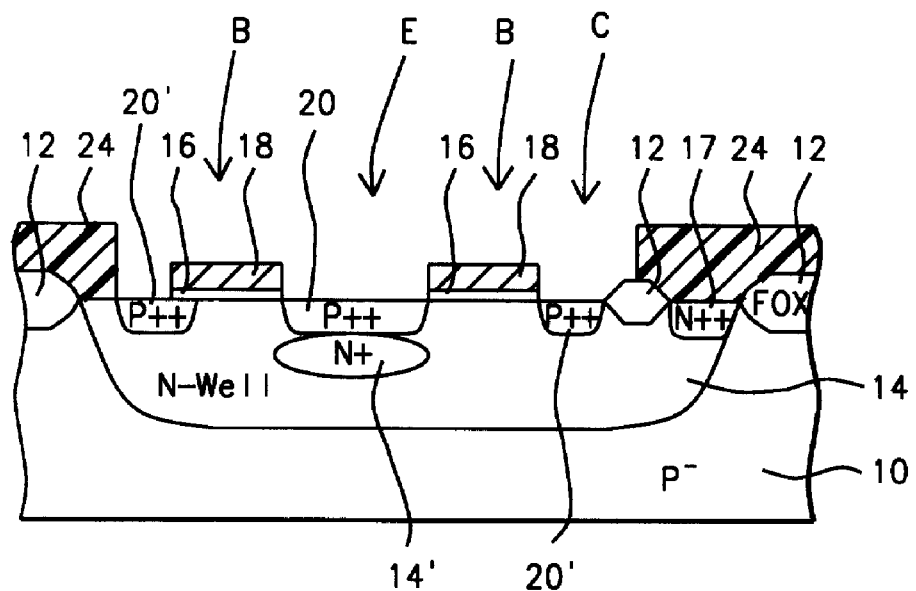

Referring now to FIG. 8, the first photoresist mask layer 19 is removed and the emitters and collectors for the L-PNP bipolars are implanted using a second photoresist mask 24 as an implant blockout mask. The second photoresist mask 24 and the patterned polysilicon layer 18 over the intrinsic base areas B of the L-PNP bipolar transistors are used as implant blockout masks to implant the emitters 20 and the collectors 20'. For the L-PNP bipolar transistor, the preferred ion implantations is carried out using a first conductive type dopant of boron (B$^{11}$), and the emitter and collector implant parameters are selected to achieve the desired dopant concentration. Preferably the emitters and collectors are heavily doped (P$^{++}$) to a concentration of between about 5.0 E 19 and 1.0 E 20 atoms/cm$^3$. The ion implant energy is selected to provide an emitter metallurgical junction depth $x_j$ that lies within the N+ buried base region 14' after final processing. The emitter is formed having a junction depth $x_j$ that lies within the buried base region 14' that has a phosphorus concentration of between about 1.0 E 18 and 2.0 E 18 atoms/cm$^3$. Typically the emitter junction depth $x_j$ is between about 0.2 and 0.4 um. This results in an emitter-base junction with a higher doped buried base 14' for the vertical PNP bipolar portion of the L-PNP bipolar transistor, while retaining the lower dopant concentration (about 1.0 E 16 to 1.0 E 17 atoms/cm$^3$) of the N-well region 14 in the intrinsic base regions B of the L-PNP. This buried base region 14' reduces the V-PNP bipolar current gain and increases the L-PNP bipolar current gain. The second photoresist layer 24 is then removed to complete the lateral PNP bipolar transistors. The N$^+$ buried base also does not intersect the N$^-$ well P$^-$ junction in the substrate, and therefore does not reduce the reverse bias breakdown voltage for the V-PNP collector-base junction.

Figure 9:
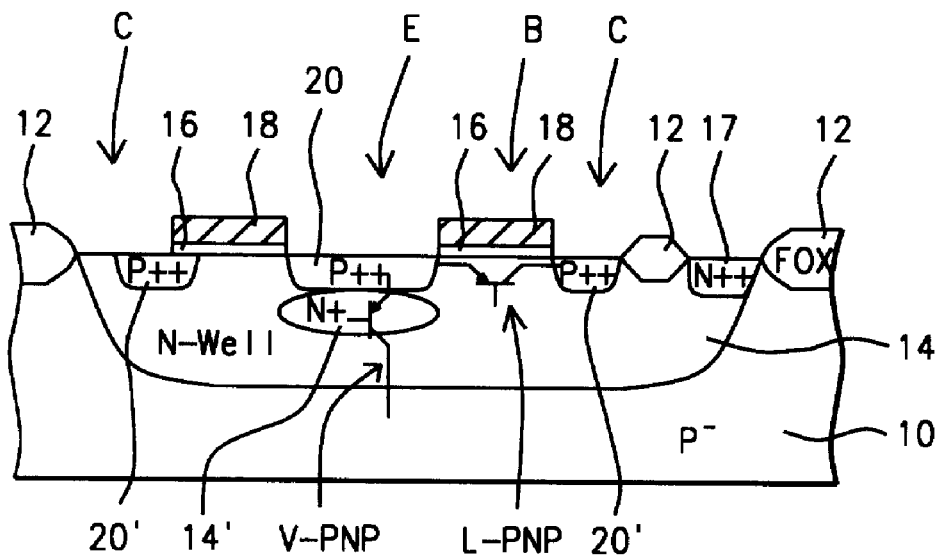

To better appreciate the objectives and other advantages of this invention, the completed lateral PNP bipolar transistor shown in cross-sectional view in FIG. 8 is again shown in FIG. 9 with typical bipolar schematic symbols for V-PNP and L-PNP bipolar transistor portions superimposed. As depicted in FIG. 9, the V-PNP bipolar portion of the transistor consists of the emitter 20, the base area comprised of the N$^+$ buried base 14' and well area 14, and the collector area consisting of the P$^-$ doped substrate 10. The desired L-PNP bipolar with higher current gain consists of the emitter 20, the intrinsic base region B formed from the lower doped N-well area 14, and the collector region 20'. Because the current gain for a bipolar is proportional to the ratio of the total-emitter-to-the-total-base charge (gain $\alpha Q_E/Q_B$), the increase in the buried base region therefore reduces the V-PNP bipolar current gain, and increases the current gain of the L-PNP bipolar having the lower doped intrinsic base 14. Alternatively, this decrease in current gain of the V-PNP can be expressed as the ratio of the emitter-to-base Gummel number (gain $\alpha GN_E/GN_B$), where the Gummel number represents the total number of active impurity atoms in the emitter and base regions expressed in active impurities per cm$^3$.

A second advantage of this invention is that the increased dopant level of the N$^+$ buried base region 14' under the emitter increases the built-in potential $V_{bi}$ for the P$^{++}$/N$^+$ emitter-base junction of the V-PNP bipolar portion relative to the P$^{++}$/N$^-$ emitter-base junction of the L-PNP bipolar. For example, this built-in voltage, which increases with dopant level in the P and N regions because of a shift in the Fermi levels, can result in a $V_{bi}$ with a difference of as much as 250 millivolts between the V-PNP and L-PNP bipolar portions. This increase in $V_{bi}$ for the V-PNP further reduces the injection current in the base of the V-PNP and can improve the L-PNP bipolar current gain by a factor of 5 to 10 times, and can result in a gain greater than 15, which is acceptable for L-PNP bipolar devices for analog and mixed-signal applications. Although the higher dopant concentration can result in a reduced emitter-base reverse bias breakdown voltage, the emitter-base junctions are always used with forward biasing and the higher concentration resulting in a reduced breakdown voltage is not an issue.

Figure 10:
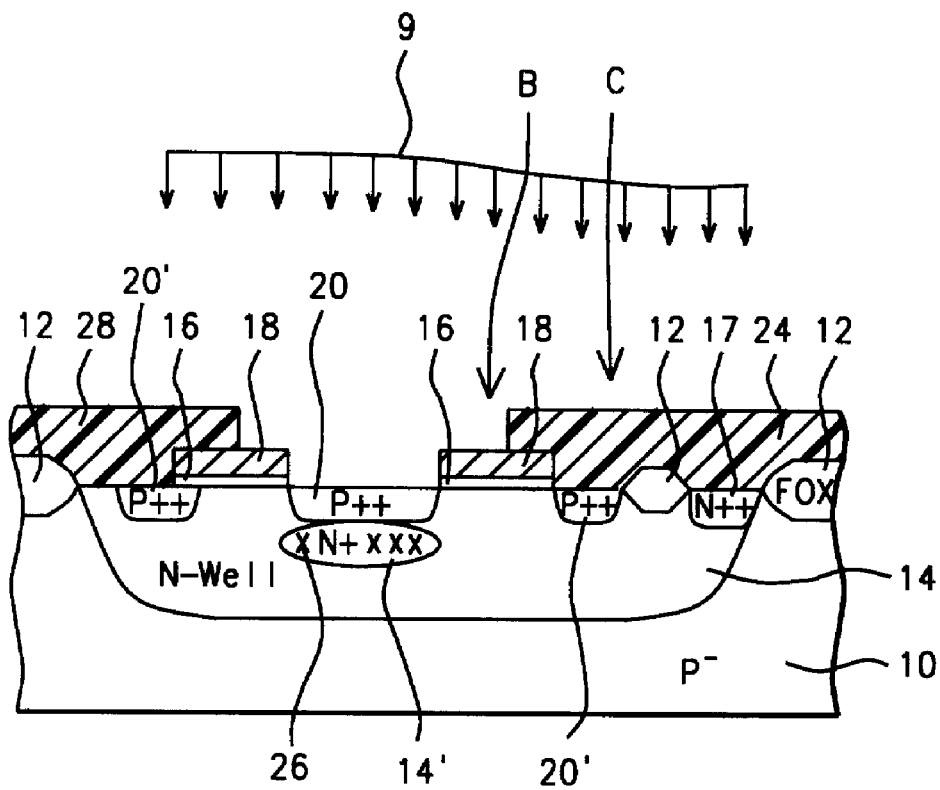
FIG. 10 shows a schematic cross-sectional view, by a second embodiment, for further improving the lateral bipolar transistors of this invention using a tetravalent impurity implant in the base region under-the emitter to reduce the minority carrier lifetime.

Referring to FIG. 10, a second embodiment is described for further reducing the current gain of the V-PNP, thereby further increasing the current gain of the L-PNP bipolar transistor. The second embodiment is identical to the first embodiment except for an additional ion implantation of a tetravalent impurity. As depicted in FIG. 10, a selective implant can be performed using an additional photoresist blockout mask 28 for implanting a tetravalent impurity, such as germanium (Ge), silicon (Si), or carbon (C). Preferably the ion implant dose is between about 1.0 E 13 and 1.0 E 14 atoms/cm$^2$, and the implant energy is selected so that the ions 26 are implanted in the buried base region 14' of the N-well 14, as depicted by the vertical arrows 9. Alternatively, the Ge, Si, or C can be implanted using the first photoresist block-out mask 19 and implanted after the N$^+$ buried base 14 is implanted. This ion implantation using tetravalent impurities further reduces the minority carrier lifetime in the buried base region 14. This implant 9 further reduces the current gain (vertical current component) of the V-PNP bipolar and improves the current gain of the L-PNP bipolar transistor.

While the invention has been particularly shown and described with reference to the preferred embodiments thereof, it will be understood by those skilled in the art that various changes in form and details may be made without departing from the spirit and scope of the invention. It should also be understood by those skilled in the art that the polarity of the dopants can be reversed to form lateral NPN bipolar transistors with improved current gain and, by including additional processing steps, that both L-PNP and L-NPN bipolar transistors can be formed concurrently on the same substrate. In addition, P-channel and N-channel FETs can be included to form BiCMOS circuits.

What is claimed is:

1. A method for making lateral bipolar transistors with improved current gain on a semiconductor substrate compatible with CMOS comprising the steps of:

providing a silicon substrate having a first conductive type dopant;

forming doped wells having a second conductive type dopant;

forming a pad oxide on said substrate;

depositing a silicon nitride layer on said pad oxide layer thereby providing an oxidation barrier layer;

patterning said silicon nitride layer and leaving portions over device areas while removing said silicon nitride layer over field oxide regions;

forming a field oxide isolation in said field oxide regions;

removing said silicon nitride layer and said pad oxide layer;

growing a gate oxide layer and depositing a polysilicon layer;

patterning said polysilicon layer and said gate oxide layer leaving portions over base areas in said device areas while removing portions of said polysilicon layer over emitter and collector areas for said lateral bipolar transistors, and concurrently patterning said polysilicon layer and said gate oxide layer to form gate electrodes for field effect transistors (FETs) elsewhere on said substrate;

ion implanting selectively said second conductive type dopant in said device areas to form a base contact for said lateral bipolar transistors;

using a first photoresist mask and selectively implanting buried base regions with said second conductive type dopant in said emitter areas and lying within said wells to improve said current gain of said lateral bipolar transistors;

using a second photoresist mask and said patterned polysilicon layer as an implant mask and selectively ion implanting said first conductive type dopant in said emitter and collector areas to form emitters and collectors, respectively, wherein said emitters form junctions with said buried base regions, and thereby completing said lateral bipolar transistors with said improved current gain.

2. The method of claim 1, wherein said first conductive type dopant is a P type dopant, and said second conductive type dopant is an N type dopant, and form PNP lateral bipolar transistors.

3. The method of claim 1, wherein said first conductive type dopant is an N type dopant, and said second conductive type dopant is a P type dopant, and form NPN lateral bipolar transistors.

4. The method of claim 1, wherein said gate oxide is silicon oxide having a thickness of between about 100 and 200 Angstroms.

5. The method of claim 1, wherein said polysilicon layer is deposited by chemical vapor deposition to a thickness of between about 2000 and 3500 Angstroms.

6. The method of claim 1, wherein said wells are doped to a concentration of between about 1.0 E 16 and 1.0 E 17 atoms/cm$^3$.

7. The method of claim 1, wherein said buried base regions are doped to a concentration of between about 5.0 E 17 and 2.0 E 18 atoms/cm$^3$.

8. The method of claim 1, wherein said emitters and said collectors are doped to a concentration of between about 5.0 E 19 and 1.0 E 20 atoms/cm$^3$.

9. The method of claim 1, wherein the junction depths of said wells in said substrate are between about 1.0 and 3.0 micrometers (um).

10. The method of claim 1, wherein the junction depths of said emitters are between about 0.2 and 0.4 micrometers.

11. The method of claim 1, wherein said current gain of said lateral bipolar transistors is at least greater than 15.

12. The method of claim 1, wherein said base regions are further modified by including a high-energy tetravalent impurity implant to reduce the minority carrier lifetime to further improve the current gain of said lateral bipolar transistors.

13. The method of claim 12, wherein said tetravalent impurity implant is selected from the group that includes germanium, silicon, and carbon.

14. A method for making BiCMOS circuits having lateral bipolar transistors with improved current gain on a semiconductor substrate comprising the steps of:

providing a silicon substrate having a first conductive type dopant;

forming doped wells having a second conductive type dopant;

forming a pad oxide on said substrate;

depositing a silicon nitride layer on said pad oxide layer thereby providing an oxidation barrier layer;

patterning said silicon nitride layer and leaving portions over device areas while removing said silicon nitride layer over field oxide regions;

forming a field oxide isolation in said field oxide regions;

removing said silicon nitride layer and said pad oxide layer;

growing a gate oxide layer and depositing a polysilicon layer;

patterning said polysilicon layer and said gate oxide layer leaving portions over base areas in said device areas while removing portions of said polysilicon layer over emitter and collector areas for said lateral bipolar transistors, and concurrently patterning said polysilicon layer and said gate oxide layer to form gate electrodes for field effect transistors (FETs) elsewhere on said substrate;

ion implanting selectively said second conductive type dopant in said device areas to form a base contact for said lateral bipolar transistors;

using a first photoresist mask and selectively implanting buried base regions with said second conductive type dopant in said emitter areas and lying within said wells to improve said current gain of said lateral bipolar transistor;

using a second photoresist mask and said patterned polysilicon layer as an implant mask and selectively ion implanting said first conductive type dopant in said emitter and collector areas to form emitters and collectors, respectively, wherein said emitters form junctions with said buried base regions, and thereby forming said lateral bipolar transistors with said improved current gain; and concurrently forming P-channel and N-channel field effect transistors (FETS) on said substrate and forming CMOS devices;

interconnecting said CMOS devices and said lateral bipolar transistors to form said BiCMOS circuits.

15. The method of claim 14, wherein said first conductive type dopant is a P type dopant, and said second conductive type dopant is an N type dopant, and form PNP lateral bipolar transistors.

16. The method of claim 14, wherein said first conductive type dopant is an N type dopant, and said second conductive type dopant is a P type dopant, and form NPN lateral bipolar transistors.

17. The method of claim 14, wherein said gate oxide is silicon oxide having a thickness of between about 100 and 200 Angstroms.

18. The method of claim 14, wherein said polysilicon layer is deposited by chemical vapor deposition to a thickness of between about 2000 and 3500 Angstroms.

19. The method of claim 14, wherein said wells are doped to a concentration of between about 1.0 E 16 and 1.0 E 17 atoms/cm$^3$.

20. The method of claim 14, wherein said buried base regions are doped to a concentration of between about 5.0 E 17 and 2.0 E 18 atoms/cm$^3$.

21. The method of claim 14, wherein said emitters and said collectors are doped to a concentration of between about 5.0 E 19 and 1.0 E 20 atoms/cm$^3$.

22. The method of claim 14, wherein the junction depths of said wells in said substrate are between about 1.0 and 3.0 micrometers (um).

23. The method of claim 14, wherein the junction depths of said emitters are between about 0.2 and 0.4 micrometers.

24. The method of claim 14, wherein said current gain of said lateral bipolar transistors is at least greater than 15.

* * * * *

UNITED STATES PATENT AND TRADEMARK OFFICE
CERTIFICATE OF CORRECTION

PATENT NO. : 6,093,613
DATED : July 25, 2000
INVENTOR(S) : Purakh Raj Verma, Joe Jin Kuek It is certified that error appears in the above-identified patent and that said Letters Patent is hereby corrected as shown below:

On the Title page, in item (75), please delete "Purakh Raj Verma, Woodlands; Joe Jin Kuek, Singapore, both of Singapore" and replace with --Purakh Raj Verma, Joe Jin Kuek, both of Singapore, Singapore--.

Signed and Sealed this

Twenty-ninth Day of May, 2001

Attest:

NICHOLAS P. GODICI

*Attesting Officer*  *Acting Director of the United States Patent and Trademark Office*

UNITED STATES PATENT AND TRADEMARK OFFICE
CERTIFICATE OF CORRECTION

PATENT NO.     : 6,093,613
DATED          : July 25, 2000
INVENTOR(S)    : Purakh Raj Verma and Joe Jin Kuek It is certified that error appears in the above-identified patent and that said Letters Patent is hereby corrected as shown below:

<u>Title page,</u>
Item [75], please delete "Purakh Raj Verma, Woodlands" and replace with
-- Purakh Raj Verma, Singapore --.

Signed and Sealed this

Twenty-fifth Day of March, 2003

JAMES E. ROGAN
*Director of the United States Patent and Trademark Office*